US005187314A

United States Patent [19]

Kunimoto et al.

[11] Patent Number: 5,187,314

[45] Date of Patent: Feb. 16, 1993

[54] MUSICAL TONE SYNTHESIZING APPARATUS WITH TIME FUNCTION EXCITATION GENERATOR

[75] Inventors: Toshifumi Kunimoto, Hamamatsu; Kaoru Kobayashi, Owariasahi, both of Japan

[73] Assignee: Yamaha Corporation, Hamamatsu, Japan

[21] Appl. No.: 634,032

[22] Filed: Dec. 26, 1990

[30] Foreign Application Priority Data

Dec. 28, 1989 [JP] Japan ................................ 1-343212

[51] Int. Cl.[5] ...................... G10H 5/07; G10D 00/00; H03G 3/00

[52] U.S. Cl. ............................... 84/626; 84/DIG. 26; 84/630; 84/623; 84/622

[58] Field of Search ................. 84/DIG. 26, 630, 662, 84/625, 622, 623, 626, 630, 707, DIG. 26; 381/49

[56] References Cited

U.S. PATENT DOCUMENTS

| | | | |
|---|---|---|---|
| 4,982,433 | 1/1991 | Yajima et al. | 381/49 |
| 4,984,276 | 1/1991 | Smith | 84/630 |
| 5,029,509 | 7/1991 | Serra et al. | 84/625 |
| 5,113,743 | 5/1992 | Higashi | 84/622 |
| 5,131,310 | 7/1992 | Kunimoto | 84/630 |

FOREIGN PATENT DOCUMENTS 63-40199 2/1988 Japan .

*Primary Examiner*—William M. Shoop, Jr.
*Assistant Examiner*—Helen Kim
*Attorney, Agent, or Firm*—Graham & James

[57] ABSTRACT

A musical tone synthesizing apparatus generates musical tones by simulating the tone generation construction of a plucked-stringed instrument or string-striking type stringed instrument. The apparatus has a closed-loop circuit which simulate a tone generating element of the instrument, an excitation circuit which creates an excitation signal corresponding to the excitation given to the tone generating element in response to the time function. The time function is set in response to operational information of the tone generating operator. The excitation signal is supplied to the closed-loop circuit and circulates around closed-loop circuit and is delayed by a delay circuit having delay interval, and is fed back into the excitation circuit as the state of the tone generating element. By displacing the excitation signal within the predetermined range of time function, the digital computation may not be in the overflow state when computing the relative displacement between the tone generating element and the tone generating operator, and thus control stability of the excitation circuit can be obtained.

12 Claims, 4 Drawing Sheets

MUSICAL TONE SYNTHESIZING APPARATUS WITH TIME FUNCTION EXCITATION GENERATOR

BACKGROUND OF THE INVENTION

1. Field of the Invention

The present invention relates to a musical tone synthesizing apparatus which synthesizes musical tones of plucked stringed instruments, struck string instruments and the like.

2. Prior Art

Devices are well known wherein, by activating the simulation model of the tone generation mechanisms of an acoustic musical instrument, sound of the acoustic musical instruments can be artificially synthesized.

As an example, there is known device which synthesizes the sound of struck string instruments such as an acoustic piano by the configuration containing a low-pass filter for simulating reverberation losses in the strings and a delay circuit for simulating propagation delays of the vibration of the strings, wherein the low-pass filter and delay circuit are connected together so as to form a closed-loop circuit. With such a device, an excitation signal (e.g., an impulse signal) is introduced into the closed-loop circuit. Thus, the introduced impulse excitation signal circulates through the closed-loop circuit once with a period identical to the period in which the vibration reciprocates through the string once. The signal circulating through the closed-loop circuit is subjected to the bandwidth restriction each time it traverses the low-pass filter. Then, the circulating signal is picked up from the closed-loop circuit as a musical tone signal.

In this case, the above-mentioned excitation signal such as impulse signal is supplied by an excitation circuit which is provided to simulate the influence of the hammer striking the strings. This excitation circuit calculates the relative displacement relationship between the strings and hammer based on the weight of hammer, the initial velocity of hammer and the circulation signal circulating in the closed-loop circuit. Then, it computes the repulsive force to be given to the hammer from the string based on the relative displacement, and finally supplies the signal representing the repulsive force to the closed-loop circuit. Furthermore, in the excitation circuit, the repulsive force is set as a control parameter which is used for calculating the relative displacement between the strings and hammer to be occurred in the next stage.

Incidentally, this type of musical tone synthesizing apparatus is disclosed in Japanese Patent Laid-open Publication No. 63-40199.

In the conventional musical tone synthesizing apparatuses described above, the excitation circuit is in the form of loop-form circuit. Therefore, in the case where the foregoing control parameter is merely changed, the digital computation may be in the overflow state when computing the relative displacement. Thus, control stability of the excitation circuit cannot be obtained.

Accordingly, the conventional musical tone synthesizing apparatus is disadvantageous in that it is difficult to find out the suitable value for the control parameter in the case where the control state and control parameters of the excitation circuit are to be varied. Thus, it is extremely difficult to vary the value of control parameter.

SUMMARY OF THE INVENTION

In consideration of the above described shortcomings of conventional apparatus for synthesizing the sound of acoustic musical instruments, a primary object of the present invention is to provide a musical tone synthesizing apparatus in which even if the control parameter is varied, the digital computation is not in the overflow state in computing the relative displacement, and control stability of the excitation circuit is obtained.

A further object of the present invention is to provide a musical tone synthesizing apparatus in which the controlling of excitation circuit and the varying the control parameters of excitation circuit can be very easy.

In one implementation of the present invention, a musical tone synthesizing apparatus comprising:

(a) closed-loop means functioning as a closed-loop circuit for carrying out a predetermined process on an input signal inputted thereto, said closed-loop means setting a delay time by which excitation signal circulates therein in response to a tone pitch of a musical tone to be generated; and (b) excitation means for creating said excitation signal, wherein said excitation signal is generated in accordance with a time function and supplied to said closed-loop means, said time function being directly set in response to operational information of a tone generating operator, and said closed-loop means exciting itself by being inputted said excitation signal thereto to generate a musical tone having a desirable tone color therefrom.

The preferred embodiments of the present invention are described in a following section with reference to the drawings, from which further objects and advantages of the present invention will become apparent.

DETAILED DESCRIPTION OF THE PREFERRED EMBODIMENTS

[A] CONFIGURATION OF FIRST EMBODIMENT

Figure 1:
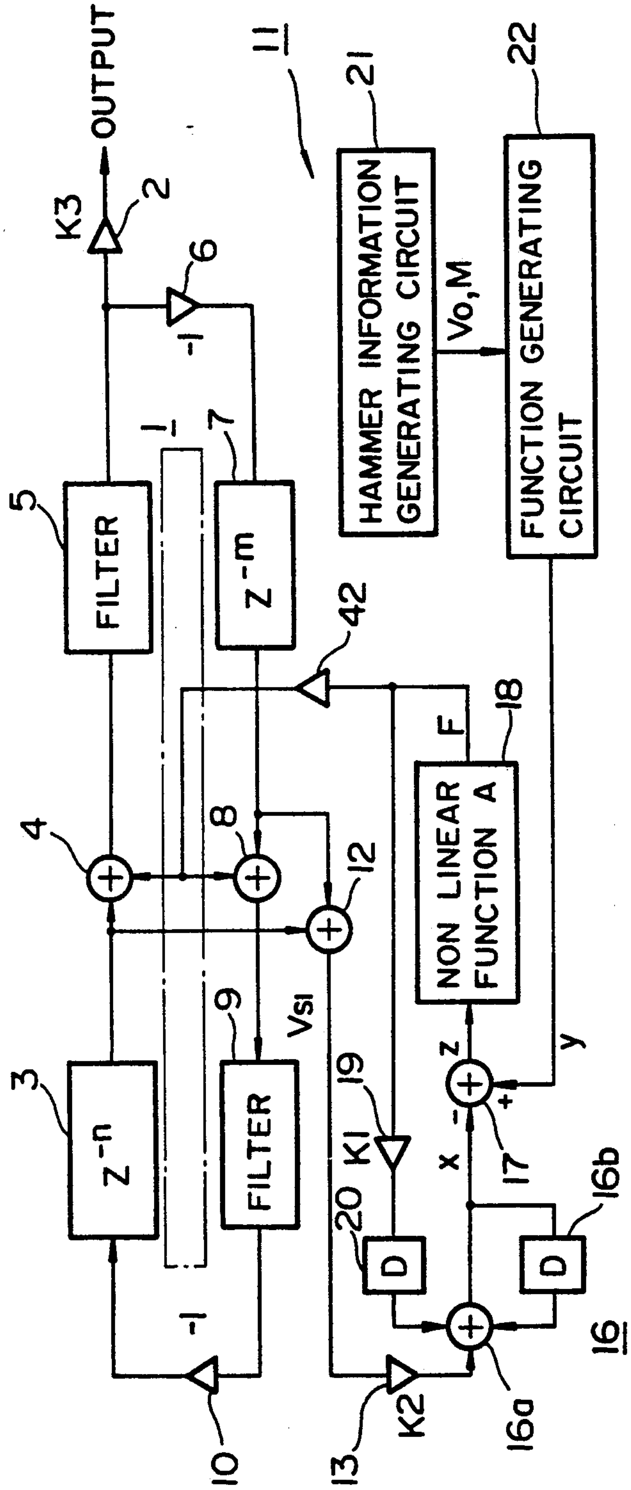
FIG. 1 is a block diagram showing the configuration of a musical tone synthesizing apparatus according to first embodiment of the present invention.

Referring to the drawings, wherein like reference characters designate like or corresponding parts throughout the views.

FIG. 1 is a block diagram showing the configuration of a musical tone synthesizing apparatus according to an embodiment of the present invention. In this musical tone synthesizing apparatus, the tones of a struck string instrument such as a piano, etc., are synthesized.

In FIG. 1, 1 designates closed-loop circuit which comprises delay circuit 3, adder 4, filter 5, phase inverting circuit 6, delay circuit 7, adder 8, filter 9 and phase inverting circuit 10. This closed-loop circuit 1 is designed to simulate the vibration of the string (corresponding to one string) of a piano.

To describe the operation of the above described the closed-loop circuit 1 in greater detail, reference will be made to FIG. 2, wherein the interaction of a hammer HM and a corresponding string S in a piano is schematically illustrated. Each end of the piano string S is secured at a respective fixation point $T_1$ or $T_2$. Conventionally, in a piano, each hammer is operated through the action of a single corresponding key on the keyboard of the piano. Thus, when a given key is depressed, the corresponding hammer strikes the one or more strings associated with that hammer. Each string S having been thus struck by the hammer HM thereby receives mechanical energy which has been imparted by the striking hammer, this mechanical energy manifested as vibrational waves Wa, Wb, each initially traveling away from the hammer HM in opposite directions, propagating along string S.

In the case of the musical tone synthesizing apparatus shown in FIG. 1, assuming that the closed loop circuit 1 is simulating the above mentioned string S, the delay interval of the delay circuit 3 corresponds to the time required for the vibrational wave Wa to travel from the striking position to the fixation point $T_1$ where it is reflected, and then back to the striking position, i.e., time for circulating. Similarly, the delay interval of the delay circuit 7 corresponds to the time require for the vibrational wave Wb to travel from the striking position to the fixation point $T_2$ and then back to the striking position. The phase inverters 6, 10 in the musical tone synthesizing apparatus correspond to the fixation points $T_1$ or $T_2$, respectively, for the string S being simulated, and function to simulate the phenomena of reverse phase reflection of the vibrational waves Wa, Wb at the fixation points $T_1$ and $T_2$. In this way, the time required for the signal corresponding to a given excitation vibration to circulate once through the closed-loop is equal to the period of the standing wave in the string S. The signal which propagates within closed-loop 1 oscillating at a frequency corresponding to the pitch of vibrating string S is supplied from closed-loop circuit 1 to an amplifier via multiplier 2 wherein the signal is amplified. In other words, the signal which circulates in the closed-loop circuit 1 is outputted and amplified as a musical tone signal with a pitch which corresponds to the length of the string S.

As the signal continues to propagate about the closed-loop circuit 1, the effect of diminishing amplitude of vibration with time which occurs in the actual string S is simulated through the action of the filters 5 and 9. In particular, through the operation of the filters 5 and 9, the phenomena of selectively greater decay in amplitude of the higher frequency harmonics in an actual string S is reproduced with fidelity. Adder 4 and 8 add the repulsive force signal F of hammer described later to the signal circulating in closed-loop circuit 1. The signal which circulates in closed-loop circuit 1 is amplified (provided that a constant K3 is multiplied) by multiplier 2 as a musical tone signal with a pitch which corresponds to the length of string S and taken out.

Again referring to FIG. 1, the operation of the closed-loop circuit 1 will be described in terms of digital components incorporated therein. The delay circuits 3 and 7 consist of shift registers comprised of multiple flip-flops, each flip-flop corresponding to a bit in the propagating signal. A sampling clock pulse is supplied at fixed intervals to each of the flip-flops. In FIG. 1, indicating letters m and n correspond to the number of registers in delay circuits 3 and 7 respectively. Accordingly, in such case, the delay time of the delay circuit 3 and 7 are set by the number of flip-flops. In addition to the delay circuits 3 and 7, the other components shown in FIG. 1 are digital devices.

Next, description will be given with respect to other components of the apparatus shown in FIG. 1. In FIG. 1, 11 designates a non-linear function generating circuit, which is made up of adder 12, multiplier 13, integrating circuit 16, substracter 17, ROM (read only memory) 18, multiplier 19, single sample period delay circuit 20, hammer information generating circuit 21 and function generating circuit 22. The non-linear function generating circuit 11 is designed to simulate the repulsive force which pushes the hammer HM causing it to return when the string S shown in FIG. 2 is struck by the hammer HM. The output signal of delay circuit 3 and that of delay circuit 7, i.e., the circulating signals, are summed in adder 12, the result of which is outputted as velocity signal $V_{s1}$ which corresponds to the vibration velocity of string S. Velocity signal $V_{s1}$ thus outputted from adder 12 is then multiplied in multiplier 13 by a multiplication coefficient K2. The result of the multiplication operation in the multiplier 13 is then supplied to integrating circuit 16 which is made up of adder 16*a* and single sample period delay circuit 16*b*. Additionally, a signal F which corresponds to the repulsive force imparted to the hammer HM by the string S in the acoustic musical instrument being synthesized is supplied to the adder 16*a*, via the multiplier 19 and single sample period delay circuit 20. The signal F is multiplied in multiplier 19 by a multiplication coefficient K1. In adder 16*a*, the output signal of single sample period delay circuit 20 and the output signal of the multiplier 13 are added together. In other words, the output signal of multiplier 13 and the signal F are added together, after which the result is integrated in integrating circuit 16.

Figure 2:
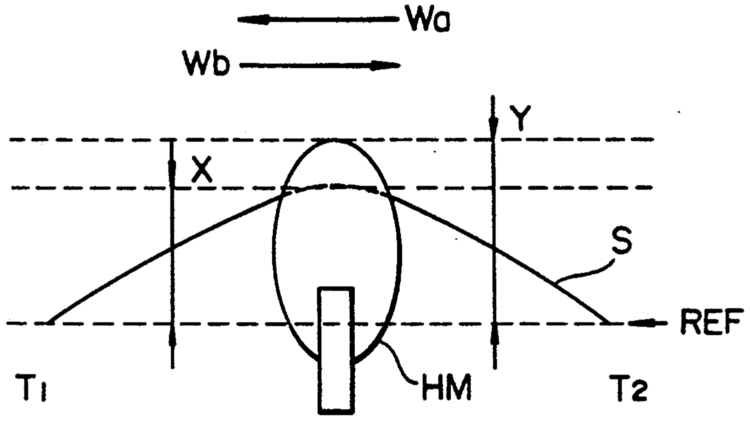
FIG. 2 is a simulation model for the purpose of explaining the point at which hammer HM strikes piano string S.

The result of integration in the integrating circuit 16 constitutes a string displacement signal x which corresponds to the displacement X of the string S from a baseline position REF as shown in FIG. 2. The above described string displacement signal x is supplied to one input terminal of the subtracter 17. To the other input terminal of subtracter 17, a hammer displacement signal y is suppled from the function generating circuit 22 which will be described later, the hammer displacement signal y corresponding to the displacement Y of the hammer HM as shown in FIG. 2. In the subtracter 17, the string displacement signal x is subtracted from the hammer displacement signal y, whereby a difference signal z is calculated and outputted, corresponding to the relative displacement between the hammer HM and string S. The above described difference signal z thus calculated is then supplied to the ROM 18.

Positive values for the difference signal z correspond to the state in which the hammer HM is indented by the string S. To the extent that the difference signal z is a large positive value, the amount of indentation of the hammer HM by the string S as represented by the difference signal z is large, and a correspondingly large value is obtained for the signal F which represents the repulsive force imparted to the hammer HM by the string S. A difference signal z value of zero represents the case where the hammer HM is lightly in contact with the string S, but is not indented thereby. Negative values for the difference signal z represent the case where the hammer HM is separated from string S. Signal F which represents the repulsive force imparted to the hammer HM by the string S is zero when difference signal z is zero or negative, that is, when hammer HM is not indented by the string S.

As described above, the difference signal z is supplied to the ROM 18 after calculation thereof. In the ROM 18, data is stored representing a non-linear function A which describes the relation between the signal F and the difference signal z, in other words, the relation between amount of indentation of the hammer HM by the string S and repulsive force exerted on the hammer HM by the string S.

Figure 3:
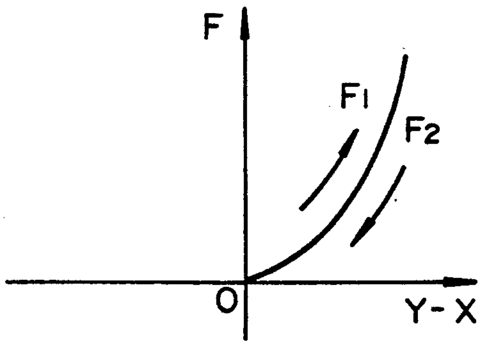
FIG. 3 is a diagram showing an example of a non-linear function in the same preferred embodiment.

An example of the non-linear function A is graphically represented in FIG. 3 wherein the value of the signal F is shown as a function of the difference signal z for the hammer HM which has been constructed from a relatively soft material such as felt. As mentioned above and as shown in the graph of FIG. 3, the repulsive force exerted on the hammer HM as expressed by the signal F is zero when difference signal z is zero or negative, that is, when simulated string S is separated from or only lightly touching hammer HM. In the acoustic instrument being simulated, hammer HM is indented by string S by an amount proportional to the force with which the hammer HM strikes string S. Thus, with striking of the string S with progressively greater force, the difference signal z representing the amount of indentation of hammer HM attains progressively greater values. Accordingly, the signal F gradually increases for progressively greater striking force. Non-linear function A is such that when representing a hammer HM which has been constructed from a relatively hard material, for example wood, the value of the signal F rises much more rapidly with increasing striking force.

As thus described, the signal F is outputted from the ROM 18 after an arbitrary time lapse following the simulated striking of the string S by the hammer HM. The signal F thus output is then supplied to the multiplier 19 and adders 4 and 8 of the closed-loop circuit 1 via a multiplier 42.

Figure 5:
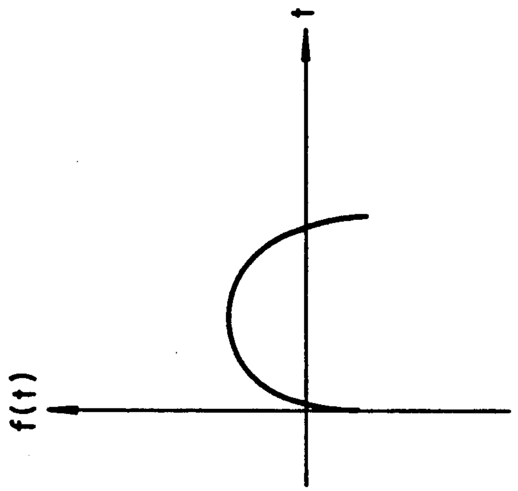
FIG. 5 is a diagram for the purpose of explaining a function with respect to time which is outputted from a function generator in the same preferred embodiment.
Figure 4:
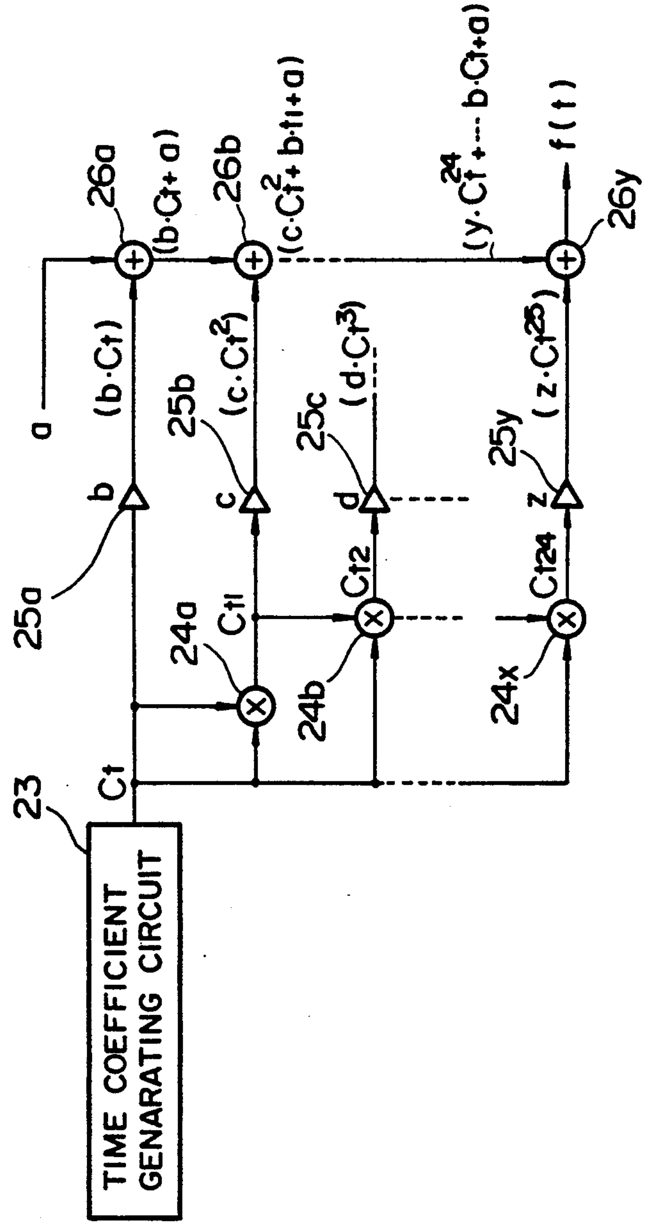
FIG. 4 is a block diagram showing an example of the configuration of a function generator in the same preferred embodiment.

The hammer information generating circuit 21 outputs the information concerning the hammer HM (e.g., initial velocity $V_0$, mass M etc.) in accordance with the performance information outputted from a tone generating operator (not shown), for example a keyboard, to the function generating circuit 22. The function generating circuit 22 outputs the hammer displacement signal y corresponding to the displacement Y of hammer HM which varies over time in response to the signals corresponding to initial velocity $V_0$ and mass M of the hammer HM supplied to the subtracter 17 described above. The time variation of hammer displacement signal y has been determined by previously, or can be set to an arbitrary value by performer. In the case of this example, the function generating circuit 22 is constructed by several components, as shown in FIG. 4. In addition, an example of the function f (t) provided by the function generating circuit 22 is shown in FIG. 5.

Referring to FIG. 4, a time coefficient generating circuit 23 can be seen, wherein time coefficients $C_t$ are generated and outputted, and which is formed from a counter or integrator, for example. The time coefficient $C_t$ outputted from the time coefficient generating circuit 23 is a function of elapsed time t which is represented by the horizontal axis in FIG. 5. A time coefficient outputted from the time coefficient generating circuit 23 at time t, that is, time coefficient $C_t$, is then supplied to multiplier 24*a*, 24*b*, 24*c*, 24*d*, . . . 24*x*, as well as to multiplier 25*a*. The value supplied to multiplier 24*a* is multiplied by itself therein, thereby generating time coefficient $C_{t1}$ which is equal to $(C_t)^2$. The result of the above squaring operation in the multiplier 24*a* is then supplied to the multipliers 24*b* and 25*b*. Time coefficient $C_{t1}$ thus supplied to the multiplier 24*b* is then multiplied therein with time coefficient $C_t$ which was previously supplied thereto, thereby generating time coefficient $C_{t2}$ which is the cube of time coefficient $C_t$, that is, $C_{t2}$ is equal to $(C_{t3})^3$. Time coefficient $C_{t2}$ is then supplied to the multiplier 24*c* (not shown in drawing) wherein it is multiplied by time coefficient $C_t$, and to multiplier 25*c*, and the process continues in a manner analogous to the above description. It can be seen that the multiplier 24*n* comes to hold the value supplied thereto from the multiplier 24(*n*-1) multiplied by time coefficient $C_t$, that is, the multiplier 24*n* comes to hold $(C_t)^{n+1}$ which is then supplied to the multipliers $\mathbf{24}_{(n+1)}$ and $\mathbf{25}_{(n+1)}$, where the multiplier 24*a*, 24*b*, 24*c*, 24*d*, . . . 24*x* have been indicated as multiplier $\mathbf{25}_1$, $\mathbf{25}_2$, $\mathbf{24}_3$, $\mathbf{24}_4$, . . . $\mathbf{24}_{(n+1)}$, $\mathbf{24}_n$, $\mathbf{24}_{(n+1)}$, . . . $\mathbf{24}_x$.

A multiplication coefficient b is held in the multiplier 25*a* which has been supplied time coefficient $C_t$ from the time coefficient generating circuit 23, and a multiplication coefficient c, d, e, . . . y and z is held in each multiplier 25*b*, 25*c*, 25*d*, . . . 25*x* and 25*y*, respectively, which have each been supplied a corresponding time coefficient from the multiplier 24*a*, 24*b*, 24*c*, . . . 24*w* and 24*x*, respectively. In each multiplier 25*a*, 25*b*, 25*c*, 25*d*, . . . 25*x* and 25*y*, the time coefficient supplied thereto is multiplied by the multiplication coefficient held therein, the result of which is supplied to a respective adder 26*a*, 26*b*, 26*c*, 26*d*, . . . 26*x* and 26*y*. Then, in each adder 26*a*, 26*b*, 26*c*, 26*d*, . . . 26*x* and 26*y*, addition operations are carried out, thereby obtaining $(b*C_t+a)$, $(c*C_t^2+b*C_t+a)$, $(d*C_t^3+c*C_t^2+b*C_t+a)$, $(e*C_t^4+d*C_t^3+c*C_t^2+b*C_t+a), \ldots,$ $(x*C_t^{23}+\ldots d*C_t^3+c*C_t^2+b*C_t+a)$, and $(y*C_t^{24}+x*C_t^{23}+\ldots d*C_t^3+c*C_t^2+b*C_t+a)$, respectively, as is shown in FIG. 4. The value thus obtained in the adder 26*y* is then outputted therefrom as f(t) as shown in Equ. (1) below:

$$f(t)=z*C_t^{25}+y*C_t^{24}+x*C_t^{23}+\ldots+d*C_t^3+c*C_t^2+b*C_t+a \qquad \text{Equ(1)}$$

[B] Operation of Embodiment

In the following section, the operation of the above described embodiment of the present invention will be explained.

First of all, the performance information is outputted from the tone generating operator, for example, from a keyboard, and then supplied to hammer information generating circuit 21. As a result, the hammer information generating circuit 21 calculates value for initial velocity $V_0$ and mass M of hammer HM and supplies these parameters to the function generating circuit 22. Based on the supplied values for initial velocity $V_0$ and mass M, function generating circuit 22 sets multiplication coefficients a through z to suitable values, after which the hammer displacement signal y is generated in response to sequentially provided time coefficients $C_t$ from coefficient generating circuit 23 as described above. The hammer displacement signal y thus generated, which varies over time as shown in the graph of FIG. 5, is then supplied to subtracter 17, as is then previously described string displacement signal x which corresponds to the displacement of string S from its baseline position.

In the subtracter 17, the string displacement signal x is subtracted from hammer displacement signal y, whereby a difference signal z is calculated and outputted to the ROM 18, corresponding to the relative displacement of hammer HM with respect to string S. As shown in FIG. 5, the hammer displacement signal y is initially negative, and rapidly rises to zero, representing contact of the hammer HM with the string S at that time, after which the hammer displacement signal y continues to increase up to its maximum positive value.

Due to the fact that the string displacement signal x is zero until the hammer displacement signal y reaches a sufficiently large value, the differential signal z is initially negative. Accordingly, the signal F outputted from the ROM 18 in response to the differential signal z, and which represents the repulsive force imparted to the hammer HM by the string S has a value of zero until immediately after the differential signal z is indented by the string S. To the extent that differential signal is a large positive value, the amount of indentation of the hammer HM by the string S as represented by the difference signal z is large, and accordingly, the repulsive force exerted on the hammer HM by the string S is correspondingly great, as reflected by a large value for signal F outputted from the ROM 18.

As shown in FIG. 1, the signal F thus generated is inputted into the closed-loop circuit 1 by means of the adder 4 and 8, having first passed through the coefficient multiplier 42. Initially, the signal F alone circulates about the closed-loop circuit 1 is outputted therefrom after traversing the delay circuits 3*a* and 7*a*, and supplied back to the non-linear function generating circuit 11 as a feedback signal via the adder 12. Additionally, the signal circulating about the closed-loop circuit 1 is outputted via the multiplier 2 as a musical tone signal.

As mentioned above and as can be seen in FIG. 1, in addition to the musical tone signal outputted via multiplier 2, the signal circulating about the closed-loop circuit 1 is outputted therefrom at a point immediately following the delay circuit 3*a* and at another point immediately following the delay circuit 7, the output signals from each of these two points in the loop being added in the adder 12 after which the resulting summation signal is supplied back to the non-linear function generating circuit 11. In the non-linear function generating circuit 11, the summation signal is supplied to the multiplier 13 as the velocity signal $V_{s1}$, wherein the summation signal is multiplied by the multiplication coefficient K2 and then supplied to the integrating circuit 16. In the adder 16*a* of integrating circuit 16, after traversing the multiplier 19 and the single sample period delay circuit 20, the above described signal F which was supplied to the closed-loop is added to the output of the multiplier 13. The result of the addition in the adder 16*a* is then integrated to thereby from a newly calculated string displacement signal x, which is then outputted to the substracter 17. In the subtracter 17, the new value for string displacement signal x is subtracted from the current value of the hammer displacement signal y, the result of which is supplied to the ROM 18 as a new differential signal z, on which basis a new value for the signal F is read from the ROM 18 and outputted. This signal F is then added to the circulating excitation signal in closed-loop circuit 1 via adder 4 and 8.

The above described processes operate circuitously as the hammer displacement signal y reaches a maximum positive value, and then decreases so as to reach a negative value, as can be seen in the graph of FIG. 5. Once the hammer displacement signal y again reaches a negative value, the excitation signal circulating in the closed-loop circuit 1 soon drops to zero through the action of the filters 5 and 9.

In the first embodiment of the present invention, the non-linear function generating circuit 11 corresponding to the excitation circuit used in the conventional apparatus is not provided within the closed-loop circuit, and the non-linear function generating circuit 11 is designed to displace the the excitation signal within the predetermined range set by the function. Therefore, even if the foregoing control parameter is merely varied, the digital computation may not be in the overflow state when computing the relative displacement between the hammer and string. Accordingly, control stability of the excitation signal can be obtained.

In addition, as the operation of the non-linear function generating circuit 11 is stabilized, delicate displacement of the excitation signal outputted from this generating circuit 11 can also be simulated in the key-depression event, and the musical tone can be synthesized, having characteristics very close to those of the acoustic instrument to be simulated.

Furthermore, as the non-linear function generating circuit 11 carries out the simulation by setting the coefficients for the function, algorithm of this simulation can be simplified and the control parameters of the non-linear function generating circuit 11 can also be varied very easily.

[B] SECOND EMBODIMENT

Concerning the function generating circuit shown in FIG. 1, many variations of this design are possible. As an example, a second preferred embodiment will be described in the following which incorporates the circuit shown in the block diagram of FIG. 6 which is used to generate f(t), where f(t) is described by the following Equ. (2):

$$f(t) = -P^{*}(|C_{T}Q|)^{N} + R \qquad \text{Equ.(2)}$$

where P represents the velocity of hammer HM and relates to key-on velocity KV, Q expresses time dependent characteristics of tone generation, R expresses volume, N is a coefficient relating to the velocity of hammer HM, and $C_t$ is a time coefficient.

Figure 6:
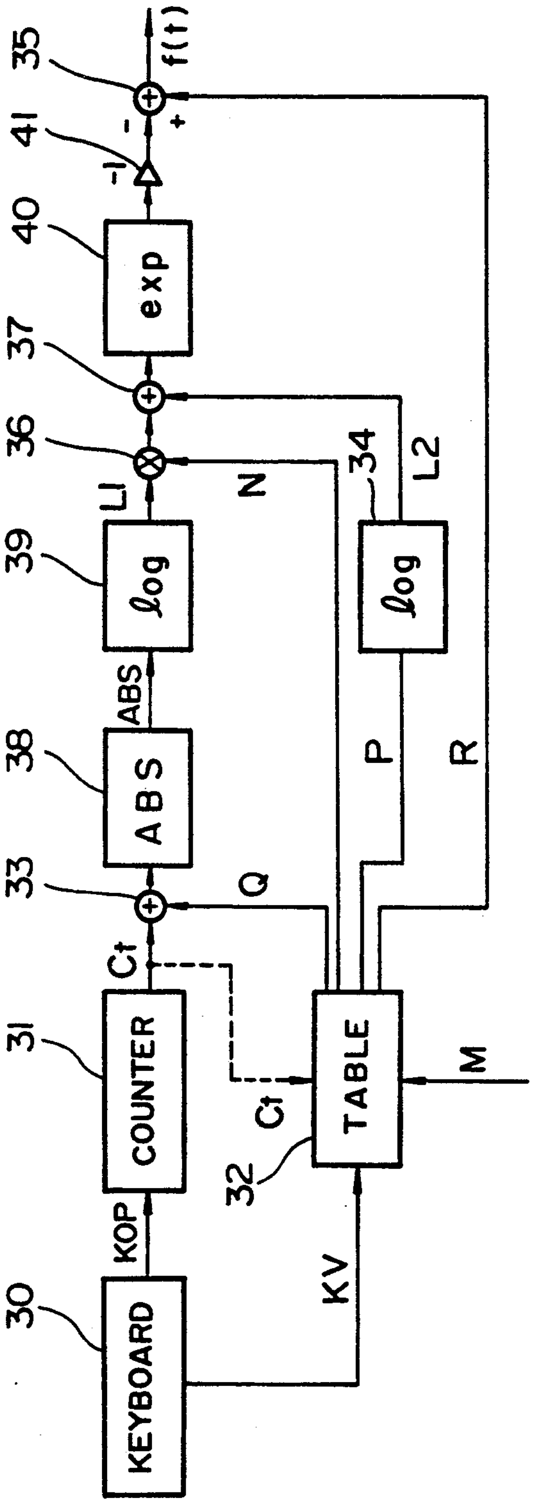
FIG. 6 is a block diagram showing the configuration of a modified example of a function generating circuit according to second embodiment of the present invention.

In the block diagram shown in FIG. 6, a keyboard 30 can be seen which outputs a key-on signal KOP to a counter 31 and a key-on velocity signal KV to data table 32 whenever key is depressed. In response to the supplied key-on signal KOP, the counter 31 begins counting, thereby generating a time coefficient $C_t$ which increases with passage of time, and which is supplied to a subtracter 33 from the counter 31. In response to the key-on velocity signal KV supplied from the keyboard 30 and data representing the mass M of hammer HM which is also supplied to thereto, the data table 32 reads out the above-mentioned coefficients P, Q, R and N which have been previously stored therein. These coefficients have been stored in the data table 32 so that in response to values for mass M and key-on velocity KV supplied thereto, the values for these coefficients outputted from the data table 32 best express the interrelationship between these two parameters.

Coefficient P is supplied to a logarithmic conversion circuit 34, Q to the above-mentioned subtracter 33, R to a adder 35 and N to a multiplier 36. The logarithmic conversion circuit 34 outputs the logarithm corresponding to the value of coefficient P supplied thereto as logarithmic signal L2 which is then supplied to a adder 37. Coefficient Q is subtracted from time coefficient $C_t$ in the above-mentioned subtracter 33, the result of which is supplied to absolute value calculation circuit 38, wherein the absolute value of the signal supplied thereto is calculated, thereby yielding:

$$|C_t-Q|$$

The absolute value calculated in the absolute value calculation circuit 38 is then outputted to the logarithm conversion circuit 39, wherein the logarithm of the signal supplied thereto is calculated and outputted as logarithm signal L1 which is then supplied to the multiplier 36. The multiplier 36 multiplies logarithmic signal L1 supplied from the logarithmic conversion circuit 39 by coefficient N supplied from the data table 32, the result of which:

$$N^{*}\log|C_t-Q| = \log(|C_t-Q|)^N$$

is added to the logarithmic signal L2 in the adder 37. The result of the addition in the adder 37 as follows:

$$N^{*}\log|C_t-Q| + \log(P) = \log P^{*}(|C_t-Q|)^N$$

is then supplied to a exponentiation circuit 40, wherein the inverse logarithm of the signal supplied thereto is calculated, thereby yielding:

$$P^{*}|C_t-Q|^N$$

The signal outputted from the exponentiation circuit 40 is converted to its arithmetic inverse, in other words, multiplied by −1 a inverter 41, and then the result of the inversion operation is added to the above described coefficient R in the adder 35, the result of which is outputted as f(t) which is identical to the value of f(t) which can be calculated using Equ. (2) above, namely:

$$-P^{*}|C_t-Q|^N+R$$

With an example of the device of the present invention incorporating the circuit shown in FIG. 6 as described above, when a key on the keyboard 30 is depressed, coefficient N, P, Q and R are outputted from the data table 32 in response to the key-on velocity KV supplied thereto from the keyboard 30. Simultaneously, the counter 31 begins counting elapsed time in response to the key-on signal KOP supplied from the keyboard 30. Through the above described sequence of calculation, f(t) as described by Equ. (2) is calculated and outputted to the subtracter 17, which has been described previously and is shown in FIG. 1. The sequence of events described previously for the first preferred embodiment of the present invention in connection with the closed-loop circuit 1 then takes place. Thus, an excitation signal is generated which rises to a maximum value as it circulates in the closed-loop circuit 1, after which the excitation signal gradually drops to zero through the action of the filters 5 and 9.

In the above described second embodiment, it is also acceptable to supply time coefficient $C_t$ to the data table 32 from the counter 31, in response to which coefficients N, P, Q and R can then be outputted, rather than in response to key-on velocity KV as has been described above. Furthermore, the data table 32 may be suitably implemented in the form of multiple data tables. In such a case, one table out of the multiple data tables can then be selected based on, for example, touch data supplied from the keyboard 30, such that the data table containing coefficients which best correspond to the supplied touch data is selected. Similarly, multiple data sets can be included in one data table, such that a suitable data set is selected based on the above-mentioned touch data, or various other parameters.

In addition to those described above, numerous other variations are possible, including, but not limited to, the following:

[1] Although the function generating circuit 22 as described above generated $n^{th}$ order functions of time coefficient $C_t$. half-wave sine functions, hamming window functions and the like are all suitable.

[2] Signal F was described as being outputted from the ROM 18 in response to a differential signal z supplied thereto, signal F may also be calculated on the basis of differential signal z using suitable circuits, rather than as data stored in the ROM.

[3] While the musical tone synthesizing apparatus of the present invention has been described as a digital device, the device of the present invention can be implemented in part or in total as an analog device. In this case, it is possible to obtain the effects similar to those of the foregoing embodiments. Additionally, the operation of above digital device can also be implemented using a D.S.P (Digital Signal Processor) or in a microprocessor CPU by using appropriate control software.

[4] Additionally, a wave guide, for example, the wave guide described in Japanese Patent Application, Laid-open No. 63-40199 may be employed as a loop circuit incorporating delay elements.

In the present specification, preferred embodiments of the musical tone synthesizing apparatus of the present invention has been described. The described embodiments are meant to be illustrative, however, and are not intended to represent limitations. Accordingly, numerous variations and enhancements thereto are possible without departing from the spirit or essential character of the present invention as described. The present invention should therefore be understood to include any apparatus and variations thereof encompassed by the scope of the appended claims.

What is claimed is:

1. A musical tone synthesizing apparatus for synthesizing sound of an acoustic musical instrument, said acoustic musical instrument comprised of a tone generating element and a tone generating operator for exciting sai dtone generating element to thereby create reciprocally propagating vibration within said tone generating element, said musical tone synthesizing apparatus comprising:

(a) closed-loop means including delay means which delays a signal inputted thereto by a delay time corresponding to a period of reciprocal propagation vibration in the tone generating element of said acoustic musical instrument; and (b) operational information generating means for generating operational information designating generation of a tone;

(c) function generating means for generating a time function, whose value varies with a lapse of time, corresponding to the operational information;

(d) modification means for receiving and modifying a feedback signal outputted from the closed-loop means; and (e) excitation means for generating an excitation signal based on the time function and the modified feedback signal and for providing the generated excitation signal to the closed-loop means as an input signal, wherein the musical tone to be generated is extracted from the closed-loop means.

2. A musical tone synthesizing apparatus according to claim 1 wherein said excitation means comprises memory means for storing data representing a non-linear function which indicates a relationship between relative displacement and relative resiliency of the tone generating element and the tone generating operator, said memory means outputting said data in accordance with said relative displacement.

3. A musical tone synthesizing apparatus according to claim 1 wherein said function generating means generates an operator displacement signal corresponding to the displacement of the tone generating operator which is varied in accordance with said time function in response to an initial velocity and mass of the tone generating operator, the operator displacement signal being varied in a lapse of time in accordance with a predetermined variation pattern which is set by a simulation in advance.

4. A musical tone synthesizing apparatus according to claim 1 wherein said function generating means generates an operator displacement signal corresponding to the displacement of the tone generating operator which is varied in accordance with said time function in response to an initial velocity and mass of the tone generating operator, the operator displacement signal being varied in a lapse of time in accordance with a variation pattern which is arbitrarily set by a performer.

5. A musical tone synthesizing apparatus according to claim 1 wherein said function generating means comprises a table for storing coefficients concerning the tone generating operator, said coefficients being calculated by a simulation so that said time function is generated based on said coefficients.

6. A musical tone synthesizing apparatus according to claim 1 wherein said time function generated by said function generating means is carried out by use of a time-variable coefficient which is represented by an $n^{th}$ order (where $n=2, \ldots$) non-linear function.

7. A musical tone synthesizing apparatus according to claim 1 wherein said time function is a half-wave sine function.

8. A musical tone synthesizing apparatus according to claim 1 wherein said time function is a hamming window function.

9. A musical tone synthesizing apparatus according to claim 1 wherein the modification means includes integrating means for integrating a signal inputted thereto to convert the feedback signal, which represents a velocity of the tone generating element, to an output signal representing displacement of the tone generating element.

10. A musical tone synthesizing apparatus comprising:

(a) closed-loop means for processing an input signal inputted thereto, said closed-loop means including delay means which delays a signal inputted thereto by a delay time corresponding to a tone pitch of a musical tone to be generated;

(b) operational information generating means for generating operational information designating generation of a tone;

(c) function generating means for generating a time function, whose value varies with a lapse of time, corresponding to the operational information;

(d) modification means for receiving and modifying a feedback signal outputted from the closed-loop means; and (e) excitation means for generating an excitation signal based on the time function and the modified feedback signal and for providing the generated excitation signal to the closed-loop means as an input signal, wherein the musical tone to be generated is extracted from the closed-loop means.

11. A musical tone synthesizing apparatus according to claim 10 wherein said excitation means comprises memory means for storing data representing a non-linear function which indicates a relationship between said excitation signal and said time function, said memory means outputting said data in accordance with said time function.

12. A musical tone synthesizing apparatus according to claim 10 wherein said tone generating operator is a hammer corresponding to a string in a piano, and said operational information is displacement of said hammer.

* * * * *